(12) United States Patent
Matsuzawa

(10) Patent No.: US 8,415,033 B2
(45) Date of Patent: Apr. 9, 2013

(54) CUTTING TOOL

(75) Inventor: Masahito Matsuzawa, Kagoshima (JP)

(73) Assignee: KYOCERA Corporation, Kyoto (JP)

( * ) Notice: Subject to any disclaimer, the term of this patent is extended or adjusted under 35 U.S.C. 154(b) by 0 days.

(21) Appl. No.: 12/863,239

(22) PCT Filed: Jan. 29, 2009

(86) PCT No.: PCT/JP2009/051483
§ 371 (c)(1),
(2), (4) Date: Jul. 16, 2010

(87) PCT Pub. No.: WO2009/096476
PCT Pub. Date: Aug. 6, 2009

(65) Prior Publication Data
US 2011/0058909 A1 Mar. 10, 2011

(30) Foreign Application Priority Data

Jan. 29, 2008 (JP) ................................ 2008-017105
Jun. 26, 2008 (JP) ................................ 2008-167413
Aug. 28, 2008 (JP) ................................ 2008-219246

(51) Int. Cl.
*B32B 9/00* (2006.01)
(52) U.S. Cl.
USPC ............... 428/697; 51/307; 51/309; 428/216; 428/325; 428/698; 428/699

(58) Field of Classification Search .................... 51/307, 51/309; 428/216, 325, 697, 698, 699, 704
See application file for complete search history.

(56) References Cited

U.S. PATENT DOCUMENTS

| | | | | |
|---|---|---|---|---|
| 5,915,162 A | * | 6/1999 | Uchino et al. | ................ 428/698 |
| 6,824,601 B2 | * | 11/2004 | Yamamoto et al. | ........... 428/699 |
| 7,192,660 B2 | * | 3/2007 | Ruppi | ........................... 428/699 |
| 7,524,569 B2 | * | 4/2009 | Okamura et al. | ............. 428/698 |
| 7,789,598 B2 | * | 9/2010 | Tanibuchi et al. | ............ 407/119 |
| 8,003,231 B2 | * | 8/2011 | Yamamoto | ...................... 51/307 |

FOREIGN PATENT DOCUMENTS

| | | |
|---|---|---|
| JP | 9295204 | 11/1997 |
| JP | 9300106 | 11/1997 |
| JP | 10330914 | 12/1998 |
| JP | 2002003284 | 1/2002 |
| JP | 2006316351 | 11/2006 |

* cited by examiner

Primary Examiner — Archene Turner
(74) Attorney, Agent, or Firm — Procopio, Cory, Hargreaves & Savitch LLP

(57) ABSTRACT

A cutting tool is disclosed. The cutting tool comprises a substrate and a coating layer on the substrate. The coating layer consists of nitride or carbonitride containing Ti and Al, and has a thickness of 3 to 9 μm on a flank face. A first intensity ratio I(400)/I(311) of the coating layer on an outer surface is larger than the first intensity ratio of the coating layer on the substrate side.

10 Claims, 13 Drawing Sheets

(a)

(b)

(a)

(b)

CUTTING TOOL

TECHNICAL FIELD

The present invention relates to a cutting tool obtained by forming a coating layer on the surface of a substrate.

BACKGROUND ART

With a cutting tool requiring abrasion resistance, sliding properties and fracture resistance, there have currently been used techniques of forming a variety of coating layers on the surface of a hard substrate made of WC-based cemented carbide, TiCN-based cermet or the like, to improve the abrasion resistance and the fracture resistance of the cutting tool.

While a TiCN layer or a TiAlN layer have been generally and broadly used as such a coating layer, there have been development of a variety of coating layers with the aim of further improving the abrasion resistance and fracture resistance.

For instance, Patent Document 1 discloses a throwaway insert where a value of a ratio I(200)/I(111) of a diffraction intensity I(200) of a plane (200) to a diffraction intensity I(111) of a plane (111) in X-ray diffraction of a TiAl composite compound layer that coats the surface of the substrate is controlled so as not to be smaller than 1. Further, Patent Document 2 discloses a throwaway insert where a value Ib(220)/Ia(111) of diffraction intensities in X-ray diffraction of a TiAl composite compound layer is set within a range of "1.0<Ib/Ia≦5.0" for enhancing oxidation resistance and flaking resistance of a coating layer.

Moreover, Patent Document 3 describes controlling peak intensity ratios of crystal planes (111), (200) and (220) which are measured in X-ray diffraction on a coating layer made of TiAlCr-based composite nitride or carbonitride. It is to be noted that few diffraction peaks of a plane (400) exist in an X-ray diffraction chart illustrated as FIG. 6 in this document. Furthermore, Patent Document 4 describes formation of a laminated structure of a first layer with a crystal plane (200) having the maximum height and a second layer with a crystal plane (111) having the maximum height in a TiAl nitride layer.

As described in above Patent Documents 1 to 4, it is known that controlling diffraction intensities in X-ray diffraction in the TiAl composite nitride layer to control characteristics of the coating layer, especially controlling the crystal planes (111), (200) and (220) having large diffraction intensities, enhances hardness and oxidation resistance of the coating layer, while also enhancing adhesiveness to the substrate.

Patent Document 1: Japanese Patent Laid Open Publication No. H9-295204
Patent Document 2: Japanese Patent Laid Open Publication No. H9-300106
Patent Document 3: Japanese Patent Laid Open Publication No. 2002-3284
Patent Document 4: Japanese Patent Laid Open Publication No. H10-330914

DISCLOSURE OF THE INVENTION

Problems to be Solved by the Invention

There has, however, been a problem with wet cutting performed on a so-called wet condition using cutting oil, especially in milling cutting, in that simply enhancing the hardness and oxidation nature of the coating layer will not lead to improvement in abrasion resistance, but instead, increasing the thickness of the coating layer causes partial flaking of the coating layer, resulting in prevention of the life of the cutting tool from being extended.

An object of the present invention is to provide a cutting tool having a long tool life even on cutting conditions requiring abrasion resistance and flaking resistance as in wet cutting.

Means for Solving the Problems

A cutting tool according to the present invention includes a substrate; and a coating layer, which coats the surface of the substrate and is made of nitride or carbonitride containing Ti and Al and in which, when a layer thickness on a flank face is 3 to 9 μm and when a ratio I(400)/I(311) of a diffraction intensity I(400) of a plane (400) to a diffraction intensity I(311) of a plane (311) concerning a thin film X-ray diffraction peak of Cu—Kα rays is taken as p, p is larger on the outer surface side than on the substrate side.

Here, it is preferable in the above configuration that, when the ratio p is taken as $p_s$ at the time of performing a thin film X-ray diffraction analysis on the outer surface of the coating layer, $p_s$ be 0.2 to 1.

It is further preferable in the above configuration that, when the ratio p is taken as $p_b$ at the time of performing the thin film X-ray diffraction analysis in a state where a region within a thickness of 1.5 μm from the substrate-side interface of the coating layer is exposed, $p_b$ be 0.1 to 0.5.

It is further preferable in the above configuration that, when a ratio $p_s/p_b$ of the ratio $p_s$ to the ratio $p_b$ is taken as r, r be 1.5 to 7.

It is further preferable according to the cutting tool according to the present invention that the coating layer is formed of a lower layer and an upper layer, and when a ratio I(400)/I(311) of a diffraction intensity I(400) of a plane (400) to a diffraction intensity I(311) of a plane (311) concerning an X-ray diffraction peak of Cu—Kα rays of the coating layer on a polished face, formed by polishing the coating layer obliquely to the thickness direction, is taken as P, $P_1$ measured on an unpolished face of the upper layer be 0.1 to 0.5, $P_3$ measured in a portion where an interface of the lower layer and the upper layer on the polished face is exposed be smaller than $P_2$ measured on the polished face of the upper layer, and $P_2$ be smaller than $P_1$.

It is further preferable in the above configuration that a total thickness $T_e$ of the coating layer on the cutting edge be 3 to 15 μm, and a ratio ($T_e/T_f$) to a thickness $T_f$ of the coating layer at a center position of the flank face be 1.2 to 3.8.

It is further preferable in the configuration that, when a ratio ($t_e/T_e$) of a thickness $t_e$ of the lower layer to the total thickness $T_e$ of the coating layer on the cutting edge is taken as A, the ratio A be 0.2 to 0.6, and when a ratio ($t_f/T_f$) of a thickness $t_f$ of the lower layer to the total thickness $T_f$ of the coating layer at the center position of the flank face is taken as a, a ratio (A/a) of the ratio A to the ratio a be 0.4 to 0.9.

It is further preferable in the cutting tool according to the present invention that the thickness of the coating layer on the cutting edge be 3 to 10 μm, and when a ratio I(220)/(I(111)+I(200)+I(220)+I(222)+I(400)) as to respective diffraction intensities I(111), I(200), I(220), I(222) and I(400) of planes (111), (200), (220), (222) and (400) concerning a micro X-ray diffraction peak of Cu—Kα rays of the coating layer is taken as q and when a value q on a rake face, a value q on the flank face and a value q on the cutting edge are respectively taken as $q_r$, $q_f$ and $q_e$, "$q_e>q_r$" and "$q_e>q_f$" hold.

Here, it is preferable in the above configuration that "$q_e>q_r>q_f$" hold.

It is further preferable in the above configuration that, when a ratio I(400)/(I(111)+I(200)+I(220)+I(222)+I(400)) as to the respective diffraction intensities I(111), I(200), I(220), I(222) and I(400) of the planes (111), (200), (220), (222) and (400) of the coating layer is taken as Q and when a value Q on the rake face, a value Q on the flank face and a value Q on the cutting edge are respectively taken as $Q_r$, $Q_f$ and $Q_e$, "$Q_r > Q_e > Q_f$" hold.

Effects of the Invention

The cutting tool according to the present invention has the significant feature in that the surface of a substrate is coated with a coating layer made of nitride or carbonitride containing Ti and Al and having a thickness of 3 to 9 μm on a flank face, and when a ratio I(400)/I(311) of a diffraction intensity I(400) of a plane (400) to a diffraction intensity I(311) of a plane (311) concerning a thin film X-ray diffraction peak of Cu—Kα rays is taken as p, p in the coating layer is larger on the outer surface side than on the substrate side. It is thereby possible to give a cutting tool having high abrasion resistance and high fracture resistance without flaking of the coating layer, thus having long tool life even in wet cutting, especially milling cutting.

In the above configuration, when the ratio p is taken as $p_s$ at the time of performing a thin film X-ray diffraction analysis on the outer surface of the coating layer, $p_s$ is 0.2 to 1, thereby exerting the effect of enhancing the abrasion resistance of the coating layer.

Further, in the above configuration, when the ratio p is taken as $p_b$ at the time of performing the thin film X-ray diffraction analysis in a state where a region within a thickness of 1.5 μm from the substrate-side interface of the coating layer is exposed, $p_b$ is 0.1 to 0.5, thereby allowing enhancement of adhesiveness. A particularly preferable range of $p_b$ is from 0.15 to 0.35.

Moreover, when a ratio $p_s/p_b$ of the ratio $p_s$ to the ratio $p_b$ is taken as r, r is 1.5 to 7, thereby allowing balancing of the abrasion resistance, the fracture resistance and the flaking resistance, to achieve an extended life.

Here, the coating layer may be a coating layer which is formed of a multilayered structure of a lower layer and an upper layer and whose orientation ($P_1$, $P_2$ $P_3$) is controlled. It is thereby possible to provide a cutting tool having high abrasion resistance without flaking of the coating layer, thus having a long tool life even in cutting with a turning tool. In addition, although the reason for the peak intensity ratio between the diffraction peaks of the plane (400) and the plane (311) being related to the adhesiveness of the coating layer is unclear, it is presumed to be associated with internal stress of the coating layer.

It is to be noted that a total thickness $T_e$ of the coating layer on the cutting edge is 3 to 15 μm, and a ratio ($T_e/T_f$) to a thickness $T_f$ of the coating layer at a center position of the flank face is 1.2 to 3.8, whereby it is possible to enhance the abrasion resistance without impairing the fracture resistance of the cutting edge.

It is preferable in the respect of allowing further control on flaking of the coating layer on the cutting edge that, when a ratio ($t_e/T_e$) of a thickness $t_e$ of the lower layer to the total thickness $T_e$ of the coating layer on the cutting edge is taken as A, the ratio A be 0.2 to 0.6, and when a ratio ($t_f/T_f$) of a thickness $t_f$ of the lower layer to the total thickness $T_f$ of the coating layer at the center position of the flank face is taken as a, a ratio (A/a) of the ratio A to the ratio a be 0.4 to 0.9.

Further, according to the cutting tool according to the present invention, it is preferable that the thickness of the coating layer on the cutting edge be 3 to 10 μm, and when a ratio I(220)/(I(111)+I(200)+I(220)+I(222)+I(400)) as to respective diffraction intensities I(111), I(200), I(220), I(222) and I(400) of planes (111), (200), (220), (222) and (400) concerning a micro X-ray diffraction peak of the Cu—Kα rays of the coating layer is taken as q and when a value q on a rake face, a value q on the flank face and a value q on the cutting edge are respectively taken as $q_r$, $q_f$ and $q_e$, "$q_e > q_r$" and "$q_e > q_f$" hold. It is thereby possible to provide a cutting tool having high abrasion resistance without flaking of the coating layer, thus having long tool life even in cutting with a milling tool.

It should be noted that, although the reason for the peak intensity ratio of the diffraction peak of the plane (220) being related to cutting performance is unclear, it is presumed to be associated with internal stress of the coating layer on the cutting edge located on a cross ridge line section. In other words, it is thought that optimizing an arrangement of a crystal of the cutting edge located on the cross ridge line section of the rake face and the flank face leads to reduction in chipping and flaking of the coating layer on the cutting edge.

While the rake face and the flank face both require high abrasion resistance, since it becomes impact load at the start of the cutting and at the time of intermittent processing, it is preferable that the chipping resistance and the fracture resistance be not lost.

It is preferable that "$q_e > q_r > q_f$" hold for improvement in adhesiveness resistance at the time of cutting.

Further, for allowing an increased thickness without occurrence of chipping or flaking due to impact at the time of cutting, to exert high abrasion resistance, it is preferable that, when a ratio I(400)/(I(111)+I(200)+I(220)+I(222)+I(400)) as to the respective diffraction intensities I(111), I(200), I(220), I(222) and I(400) of the planes (111), (200), (220), (222) and (400) of the coating layer is taken as Q and when a value Q on the rake face, a value Q on the flank face and a value Q on the cutting edge are respectively taken as $Q_r$, $Q_f$ and $Q_e$, "$Q_r > Q_e > Q_f$" hold.

BEST MODE FOR CARRYING OUT THE INVENTION

First Embodiment

An example of the cutting tools according to the present invention will be described with reference to: FIG. 1 as a schematic perspective view concerning a insert section of a throwaway milling tool (hereinafter simply abbreviated as tool) A mounted with a throwaway insert (hereinafter simply abbreviated as insert) as a case in point; FIG. 2 as (a) a schematic perspective view of the insert 1 to be mounted and (b) a plan view of the same; FIG. 3 as a sectional view taken along line a-a of FIG. 2(a) concerning the insert 1 of FIG. 2; and FIG. 4 as an example of thin film X-ray diffraction patterns concerning a coating layer 9 of the insert 1 of FIG. 3 at the time of performing a thin film X-ray diffraction measurement (s) on the outer surface, and (b) in a state where a area with a layer thickness within 1.5 μm from the substrate is exposed.

According to FIGS. 1 to 3, in the insert 1, a cross ridge line of the principal face forming a rake face 3 and the side face forming a flank face 4 of a substrate 2, with its principal face having a substantially flat shape, forms a cutting edge 8 including a major cutting edge 6 and a minor cutting edge 7 with a corner cutting edge 5 sandwiched therebetween, and the surface of the substrate 2 is coated with a coating layer 9. Further, in the tool A, the insert 1 is mounted in the insert pocket 12 of a holder 11. A screw 13 is inserted into a screw hole 14 formed at the center of the insert 1, and then screwed into the holder 11, and the insert 1 is thereby cramped to the holder 11.

As shown in FIGS. 3 and 4, the present invention has a significant feature in that the coating layer 9 made of nitride or carbonitride containing Ti and Al and having a thickness of 3 to 9 µm on a flank face is coated, and when a ratio I(400)/I(311) of a diffraction intensity I(400) of a plane (400) to a diffraction intensity I(311) of a plane (311) concerning a thin film X-ray diffraction peak of Cu—Kα rays on the coating layer 9 is taken as p, p on the coating layer 9 is larger on the outer surface side than on the substrate 2 side. It is thereby possible to provide a cutting tool having high abrasion resistance and high fracture resistance without flaking of the coating layer, thus having a long tool life even in wet cutting. In particular, it is possible to significantly suppress the development of boundary damage apt to occur at the time of milling cutting.

More specifically, when the thickness of the coating layer 9 on the flank face is smaller than 3 µm, the abrasion resistance sharply deteriorates and abrasion develops due to noching or the like, whereby the tool reaches the end of its tool life. On the contrary, when the thickness of the coating layer 9 on the flank face exceeds 10 µm, the coating layer 9 is apt to be partially peeled, and the abrasion may develop due to the flaking, causing the tool to reach the end of its tool life at the early stage. A preferable thickness of the coating layer 9 is in the range of 5 to 8 µm. Further, when the ratio p on the substrate 2 side is smaller than or equal to that on the outer surface side, the abrasion resistance of the insert 1 deteriorates, and for example in cutting such as milling wet cutting, the boundary damage is particularly apt to occur, and the tool life of the tool is thus reduced.

It is to be noted that in the above configuration, when the ratio p at the time of performing a thin film X-ray diffraction analysis on the outer surface of the coating layer 9 is taken as $p_s$, $p_s$ is 0.2 to 1, whereby the abrasion resistance of the coating layer 9 can be enhanced. $p_s$ is preferably in the range of 0.45 to 0.9.

Further, in the above configuration, when the ratio p at the time of performing the thin film X-ray diffraction analysis in a state where area with a layer thickness within 1.5 µm from the substrate 2 side interface of the coating layer 9 is exposed is taken as $p_b$, $p_b$ is 0.1 to 0.5, whereby adhesiveness of the coating layer 9 to the substrate 2 is improved. $P_b$ is preferably in the range of 0.2 to 0.4.

It is further preferable that, when a ratio $p_s/p_b$ of the ratio $p_s$ to the ratio $p_b$ is taken as r, r be 1.5 to 7. That is, when r is in this range, the abrasion of the coating layer 9 is proceeding slowly and the occurrence of micro flaking of the coating layer 9 or the like can be suppressed. Here, r is further preferably in the range of 2.5 to 4.5.

A honing 10 can further be provided in the corner cutting edge 5. While the shape of the honing 10 is preferably round R honing for suppressing flaking of the coating layer 9, it may be C honing (chamfer honing). It should be noted that as for a honing amount, a ratio $R_r/R_f$ of $R_r$ on the rake face 3 side to $R_f$ on the flank face 4 side is preferably 1 to 1.5 in respect of the balance between the edge of the corner cutting edge 5 and fracture resistance performance. Further, it is preferable that the major cutting edge 6 side be larger and the minor cutting edge 7 side be smaller, the major cutting edge 6 being an end cutting edge and the minor cutting edge 7 being a peripheral cutting edge, for realizing a configuration suitable for a cutting environment of the cutting edge 8 at each position, to deliver the optimal cutting performance.

Moreover, it is preferable that the coating layer 9 be formed by sputtering because it renders a smooth surface and high adhesiveness resistance, as well as making the coating layer 9 resistant to occurrence of chipping and flaking without being self-destructed even when inner stress existing in the coating layer 9 is made smaller and the layer thickness is made larger.

Furthermore, while the coating layer 9 may be constituted of a simple composite of $Ti_{1-a}Al_aN$, for example, it may also be constituted of $Ti_{1-a-b}Al_aM_b(C_xN_{1-x})$ (where M is one or more kinds selected from Group 4, 5 and 6 elements of the periodic table except for Ti, rare-earth elements, and Si, and "$0 \leq a < 1$", "$0 < b \leq 1$" and "$0 \leq x \leq 1$" hold). It is to be noted that the composition of the coating layer 9 can be measured by energy dispersive X-ray spectrometry (EDS) or X-ray photoelectron spectroscopy (XPS).

As the substrate, in addition to cemented carbide or a cermet made up of a hard phase primarily composed of tungsten carbide or titanium carbonitride and a bonding phase primarily composed of an iron group metal such as cobalt or nickel, a hard material such as ultrahigh-pressure sintered compact obtained by sintering a hard phase made of ceramic primarily composed of silicon nitride or aluminum oxide, polycrystalline diamond or cubic boron nitride, and a bonding phase made of ceramic, iron group metal or the like under extreme pressure is preferably used.

While the cutting tool according to the present invention is usable on a variety of cutting conditions as the cutting tool, the tool particularly shows high abrasion resistance and fracture resistance on wet cutting conditions where cutting is performed using a cutting oil especially at the time of performing milling including end milling and drilling.

Manufacturing Method

Next described is an example of manufacturing methods concerning the cutting tool according to the aforementioned first embodiment.

First, a substrate in the shape of the tool is produced using a known method. Next, a coating layer is formed on the surface of the substrate. As the method for forming the coating layer, physical vapor deposition (PVD) such as ion plating or sputtering can be preferably adapted.

To describe an example of the coating methods in detail, in the case of producing the coating layer by ion plating, a metal target respectively independently containing metallic titanium (Ti), metallic aluminum (Al), and metallic M (where M is one or more kinds selected from Group 4, 5 and 6 elements of the periodic table except for Ti, rare-earth elements and Si), or an alloy target in combination of these is adopted.

As coating conditions, conditions can be preferably adopted where a metal source is evaporated and ionized by arc discharge, grow discharge or the like with use of the target, and is simultaneously reacted with a nitrogen ($N_2$) gas as a nitrogen source and a methane ($CH_4$)/acetylene ($C_2H_2$) gas as a carbon source. At this time, using a mixed gas of a nitride ($N_2$) gas and an argon (Ar) gas with flow rates of nitrogen to the argon gas in a ratio of 1:9 to 4:6, a coating layer is formed by ion plating or sputtering at a film formation temperature of 450 to 550° C. with a sputtering power of 6 to 9 kW or a bias voltage of 30 to 200 V. According to the present invention, the layer coated by sputtering is preferably used since it is possible to form a uniform organization without generation of an abnormal section such as a droplet that is generated at the time of film formation by arc ion plating. Further, with low internal stress, even when the layer thickness is made larger, deterioration in fracture resistance due to accumulation of the internal stress tends not to occur. Therefore, thick layer can be formed and brittle flaking during processing can be suppressed so as to exert the effect of improving the abrasion resistance by the surface coating.

According to the present invention, controlling a revolution speed of the sample during film formation to a higher speed in a latter period of the film formation than in a former period of the film formation can achieve the foregoing configuration of the coating layer.

Second Embodiment

A second embodiment of the cutting tool according to the present invention is described based upon an example of throwaway drills as a case in point. FIG. 6 is a schematic side view showing a drill according to the present embodiment. FIG. 7 is a schematic front view of the drill of FIG. 6 seen from its insert. FIG. 8 is a pattern view for explaining arrangements of an outer cutting edge and an inner cutting edge at the time of cutting with the drill of FIG. 6. It should be noted that in FIG. 8, an insert indicated by a broken line shows a position after revolution of the insert indicated by a solid line by 180 degrees.

As shown in FIGS. 6 to 8, a drill 21 according to the present embodiment is mounted separately with later-described two throwaway inserts (hereinafter simply abbreviated as inserts) 23 at the insert section of a tool body 22 with a rotating axis O at the center. One insert 23a is mounted at the insert section of the tool body 22 with a screw 24 such that an inner cutting edge 25 protrudes, and the other insert 23b is mounted with a screw 24 radially outside the insert 23a at the insert of the tool body 22 from the outer peripheral direction of the tool body 22 to the insert section of the tool body 22 such that the outer cutting edge 26 protrudes. That is, the insert 23a with the inner cutting edge 25 protruding from the tool body 22 is provided radially inside the insert 23b with the outer cutting edge 26 protruding from the tool body 22.

Here, the tool body 22 is formed in a substantially cylindrical shape, and has a revolution axis (line O in FIGS. 6 to 8) of the drill 21 and a shank section 28 on the rear end side for fixing itself to a tool machine, while being spirally formed with a chip discharge groove 29 on the insert side from the shank section 28 for discharging chips from the insert to the rear end of the tool body 22. Further, insert pockets 30 (30a, 30b) for fixing of the inserts 23 are provided at two positions in the insert section of the tool body 22, where an inner-side insert pocket 30a is opened to the axially insert side of the tool body 22 and mounted with the insert 23a, and an outer-side insert pocket 30b is opened from the axially insert side of the tool body 22 to the outer cutting edge and mounted with the insert 23b.

The drill 21 then cuts with the inner cutting edge 25 the inner peripheral side of the hole bottom face of a material to be cut (not shown) and cuts with the outer cutting edge 26 the outside and the outer periphery of the hole bottom face of the material to be cut (not shown), and as shown in FIGS. 7 and 8, the inner cutting edge 25 and the outer cutting edge 26 are arranged such that revolution paths of the inner cutting edge 25 and the outer cutting edge 26 cross each other and the cutting edges totally coat the drill 21 from the insert to the periphery thereof.

The insert 23 mounted in the drill 21 will be described in detail. FIG. 9 is a plan view showing the insert of the present embodiment. FIG. 10 is (a) a side view of the insert of FIG. 9 seen from the arrow A side, and (b) a side view of the same seen from the arrow B side. FIG. 11 is (a) an expanded view showing a cross section of the insert of FIG. 9 along line I-I and (b) an expanded view showing a cross section of the same along line II-II.

The insert 23 according to the embodiments shown in FIGS. 9 to 11 is formed in the shape of a substantially polygonal plate as seen from the above, and is formed with a through hole 34 at the center section of an upper face 31. Further, as shown in FIG. 11, a coating layer 36 is formed to cover the surface of a substrate 35 in the insert 23, and on a cross ridge line section 41 of the upper surface 31 and a side face 32 of the insert 23, the inner cutting edge 25 and the outer cutting edge 26 are formed adjacently to each other.

Here, according to the present embodiment, the coating layer 36 made of nitride or carbonitride containing Ti and Al and having a thickness of 3 to 15 μm on the cross ridge line section 41 is coated, and as shown in FIG. 11, the coating layer 36 is formed of a lower layer 38 and an upper layer 39. When a ratio I(400)/I(311) of a diffraction intensity I(400) of a plane (400) to a diffraction intensity I(311) of a plane (311) concerning a micro X-ray diffraction peak of Cu—Kα rays of the coating layer 36 on a polished face formed by polishing the coating layer 36 obliquely to the thickness direction is taken as P, it is configured that $P_1$ measured on an unpolished face of the upper layer 39 is 0.1 to 0.5, $P_3$ measured in a portion where an interface of the lower layer 38 and the upper layer 39 on the polished face is exposed is smaller than $P_2$ measured on the polished face of the upper layer 39, and $P_2$ is smaller than $P_1$.

It is thereby possible to give the insert 23 having high abrasion resistance and high fracture resistance without flaking of the coating layer 36 in cutting, thus having a long tool life. In particular, even when the layer thickness on the cutting edge (inner cutting edge 25, outer cutting edge 26) on the coating layer 36 is made as large as 3 to 15 μm, the occurrence of cracking at the time of coating as the inner stress increases in the coating layer 36 on the cutting edge (inner cutting edge 25, outer cutting edge 26) and the occurrence of chipping of the cutting edge at the early stage of cutting due to a defect remaining inside the coating layer 36 are lowered. The thickness of the coating layer 36 is preferably in the range of 4 to 12 μm, and particularly preferably in the range of 4 to 8 μm.

It is to be noted that the present embodiment also has a configuration where, as for p, "$p_s > p_b$" holds, and p is larger on the outer surface side than on the substrate side.

Here, a total thickness $T_e$ of the coating layer 36 on the cutting edge (inner cutting edge 25, outer cutting edge 26) is 3 to 15 μm, and a ratio ($T_e/T_f$) to a thickness $T_f$ of the coating layer 36 at a center position in the height direction (direction vertical to the cutting edge (inner cutting edge 25, outer cutting edge 26)) of the insert 23 as the center of the flank face (side surface 32) is 1.2 to 3.8, whereby it is possible to enhance the abrasion resistance of the cutting edge without impairing the fracture resistance thereof.

At this time, in the respect of allowing further control on flaking of the coating layer 36 on the cutting edge (inner cutting edge 25, outer cutting edge 26), it is preferable that, when a ratio ($t_e/T_e$) of a thickness $t_e$ of the lower layer 38 to the total thickness $T_e$ of the coating layer 36 on the cutting edge (inner cutting edge 25, outer cutting edge 26) is taken as A, the ratio A be 0.2 to 0.6, and when a ratio ($t_f/T_f$) of a thickness $t_f$ of the lower layer 38 to the total thickness $T_f$ of the coating layer 36 at a center position of the flank face (side surface 32) in the height direction of the insert 23 is taken as a, a ratio (A/a) of the ratio A to the ratio a be 0.4 to 0.9.

Further, it is preferable that the coating layer 36 be formed by physical vapor deposition (PVD), and it is more preferable that the lower layer 38 be formed by sputtering and the upper layer 39 be formed by arc ion plating in the respect of controlling the orientation of each layer, to obtain the hardness and adhesiveness of the coating layer 36. Moreover, in the case of the coating layer 36 with a later-mentioned composition, even when the coating layer 36 is formed to have large thickness, self-destruction of the coating layer 36 does not occur, and hence it is possible to suppress the occurrence of chipping and self-destruction of the coating layer 36.

While the composition of the coating layer 36 may be formed of simple $Ti_{1-a}Al_aN$, for example, it may also be formed of $Ti_{1-a-b}Al_aM_b(C_xN_{1-x})$ (where M is one or more kinds selected from Group 4, 5 and 6 elements of the periodic table except for Ti, rare-earth elements and Si, and "$0 \leq a < 1$", "$0 < b \leq 1$" and "$0 \leq x \leq 1$" hold). Especially, when it is formed of $T_{1-a-b-c}Al_aM_bW_c(C_yN_{1-y})$ (where M is one or more kinds selected from Group 4, 5 and 6 elements of the periodic table except for Ti and W, rare-earth elements and Si, and "$0.4 \leq a \leq 0.65$", "$0 \leq b \leq 0.5$", "$0.01 \leq c \leq 0.3$" and "$0 \leq y \leq 0.8$" hold), the coating layer 36 can be formed to have large thickness. It is to be noted that the composition of the coating layer 36 can be measured by energy dispersive X-ray spectrometry (EDS) or X-ray photoelectron spectroscopy (XPS).

Further, as shown in FIG. 11(a), while the inner cutting edge 25 is formed on the cross ridge line section 41 of the upper face 31 (inner-cutting-edge rake face 43) and the side face 32 (inner-cutting-edge flank face 44) of the insert 23, as shown in FIG. 11(a), an inner-cutting-edge land 42 of 0.05 to 0.15 mm and the inner-cutting-edge rake face 43 inclined downward with an inner-cutting-edge rake angle $\alpha_1$ (angle formed by a virtual extended line $L_2$ of the inner-cutting-edge rake face 43 and line $L_3$ parallel to the lower surface 40) of 5 to 25° are formed sequentially from the inner cutting edge 25. Moreover, the inner-blade flank face 44 is formed on the side face 32 of the inner cutting edge 25 with an inner-cutting-edge flank angle $\beta_1$. In addition, a line vertical to the lower face (seated face) is denoted as $L_1$ in FIG. 11.

On the other hand, as shown in FIG. 11(b), the outer cutting edge 26 is formed on the cross ridge line section 41 of the upper face 31 (outer cutting edge rake face 49) and the side face 32 (outer-cutting-edge flank face 50) formed with an outer-cutting-edge flank angle $\beta_2$, and as shown in FIG. 9, the outer cutting edge 26 has on its one end side a protrusion 46 protruding outward from the insert 23 as seen from the above. As shown in FIG. 11(b), an outer-cutting-edge land 47 of 0.05 to 0.15 mm, an outer-cutting-edge breaker groove 48 with a width of 1.2 to 2 mm and a depth of 0.03 to 0.15 mm and an outer-cutting-edge land section 45 are formed in succession sequentially from the outer cutting edge 26. Further, an outer-cutting-edge flank face 50 is formed on the side face 32 of the outer cutting edge 26.

The outer-cutting-edge breaker groove 48 is made up of the outer-cutting-edge rake face 49 inclined downward with a rake angle $\alpha_2$ (angle formed by a virtual extended line $L_4$ of the outer-cutting-edge rake face 49 and the line $L_3$ parallel to the lower surface 40) of 5 to 25°, and an outer-cutting-edge rising face 51 rising from the outer-cutting-edge rake face 49 toward the center side (through hole 34 side) of the insert 23 with a rising angle $\gamma$ (angle formed by a virtual extended line $L_5$ of the outer-cutting-edge rising face 51 and the line $L_3$ parallel to the lower surface 40) of 20 to 45°.

It should be noted that for the substrate 35 constituting the insert 23, a similar material to that in the first embodiment can be preferably used.

Manufacturing Method

As the method for forming the coating layer 36 on the substrate 35 after sintering, physical vapor deposition (PVD) such as ion plating or sputtering can be preferably adapted. Particularly, as an example of preferred coating methods according to the present invention, there can be cited a method for forming the coating layer 36 with use of a film formation apparatus 60 including both a magnetron sputtering cathode and arc ion plating cathode as shown in a pattern view of FIG. 13. That is, a method of forming the lower layer 38 by magnetron sputtering and forming the upper layer 39 by arc ion plating is preferably used.

In other words, the film formation apparatus 60 of FIG. 13 includes a sputtering section 68 that introduces a gas of $N_2$, Ar or the like from a gas inlet 62 into a vacuum chamber 61, and has a cathode electrode 67 and an anode electrode 64, and the lower layer 38 is formed on the surface of the substrate 35 by sputtering between the electrodes.

After completing formation of the lower layer 38, the film formation apparatus 60 stops the arc discharge between a cathode electrode 63 and the anode electrode 64, applies high pressure between the cathode electrode 63 and the anode electrode 64 to generate plasma, evaporates desired metal or ceramic from the target 65 with this plasma, while ionizing it so as to come into a high energy state, and continues the film formation by an arc ion plating section 66 that makes this ionized metal adhere to the surface of a sample (substrate 35), so that the upper layer 39 is formed on the surface of the lower layer 38.

Further, according to FIG. 13, a heater 69 for heating the substrate 35, a gas outlet 70 for discharging a gas out of the system, and a bias power supply 71 for applying a bias voltage to the substrate 35 are arranged. A metal source is evaporated and ionized by arc discharge, grow discharge or the like with use of the target 65, and is simultaneously reacted with a nitrogen ($N_2$) gas as a nitrogen source and a methane ($CH_4$)/acetylene ($C_2H_2$) gas as a carbon source, to deposit the coating layer 36 on the surface of the substrate 35.

Specifically, a pulse power of 3 to 7 kW is applied to a magnetron sputtering cathode at a film formation temperature of 500 to 700° C. At that time, a repeated frequency is set to 20 to 100 kHz, and a duty cycle is set to 5 to 80%. As a bias voltage, a pulse DC voltage of 30 to 150 V, 50 to 350 kHz is applied and a nitrogen gas of 0.3 to 0.8 Pa is passed, to bring the state into a discharging state, thereby forming the lower layer 38.

Next, the ark discharge, the glow discharge or the like is applied onto the arc ion plating cathode with a bias voltage of 30 to 200 V at a film formation temperature of 400 to 600° C. to evaporate and ionize the metal source, and simultaneously, the nitrogen ($N_2$) gas as the nitrogen source and the methane ($CH_4$)/acetylene ($C_2H_2$) gas as the carbon source are passed at a gas pressure of 2 to 5 Pa so as to be reacted, thereby forming the upper layer 39 on the surface of the lower layer 38.

Moreover, according to FIG. 13, a configuration is formed where the substrate 35 is placed in each of a plurality of sample supporting sections 74 provided in a sample supporting jig 73 mounted on a table 72 such that the rake face is opposed to the target 65, and a plurality of towers 76 are arranged (eight sets of sample supporting jigs 73 and two sets of towers 76 are shown in FIG. 13). In addition, it is taken into consideration that the sample supporting jig 73, the tower 76 and the table 72 are separately revolved and each sample is sequentially opposed to the target 65 so as to make the thickness of the coating layer uniform. In the present invention, the revolution speed in forming the upper layer 39 is made higher than the revolution speed in forming the lower layer 38 in the ratio of 1.1 to 3.0, thereby allowing control on the oriented states of the lower layer 38 and the upper layer 39.

It should be noted that the target may include a metal target independently containing metallic titanium (Ti), metallic aluminum (Al), metallic W, metallic Si, metallic M (where M is one or more kinds selected from Group 4, 5 and 6 elements of the periodic table except for Ti and W, and rare-earth elements), an alloy target in combination of these, or a mixed target made of a powder or a sintered object of a compound of these carbide, nitride and boride.

Third Embodiment

A third embodiment of the cutting tool according to the present invention is described based upon an example of throwaway drills as a case in point. Basic configurations of the drill according to the present invention are the same as those of the drill and the insert shown in the second embodiment described above.

Here, according to the present embodiment, as shown in FIG. 12, a coating layer 52 made of nitride or carbonitride containing Ti and Al and having a thickness of 3 to 10 μm on a cutting edge is coated, and when a ratio $I(220)/(I(111)+I(200)+I(220)+I(222)+I(400))$ as to respective diffraction intensities $I(111)$, $I(200)$, $I(220)$, $I(222)$ and $I(400)$ of planes (111), (200), (220), (222) and (400) concerning a micro X-ray diffraction peak of Cu—Kα rays of the coating layer 52 is taken as q and when a value q on a rake face (upper face 31 of FIGS. 9, 10), a value q on the flank face (side face 32 of FIG. 9, 10) and the value q on the cutting edge (inner cutting edge 25, outer cutting edge 26 of FIG. 12) are respectively taken as $q_r$, $q_f$ and $q_e$, "$q_e > q_r$" and "$q_e > q_f$" hold.

It is thereby possible to give an insert 53 having high abrasion resistance and high fracture resistance without flaking of the coating layer 52 in cutting, thus having a long tool life. Especially, even when the thickness of the coating layer 52 on the cutting edge (inner cutting edge 25, outer cutting edge 26) is made as large as 3 to 10 μm, the occurrence of cracking at the time of film formation as the inner stress increases in the coating layer 52 on the cutting edge (inner cutting edge 25, outer cutting edge 26) and the occurrence of chipping of the cutting edge (inner cutting edge 25, outer cutting edge 26) at the early stage of cutting due to a defect remaining inside the coating layer 52 are prevented.

It is preferable here that "$q_e > q_r > q_f$" hold for improvement in adhesiveness resistance at the time of cutting.

Further, for allowing an increased thickness without occurrence of chipping or flaking due to impact at the time of cutting, to exert high abrasion resistance, it is preferable that, when a ratio $I(400)/(I(111)+I(200)+I(220)+I(222)+I(400))$ as to the respective diffraction intensities $I(111)$, $I(200)$, $I(220)$, $I(222)$ and $I(400)$ of the planes (111), (200), (220), (222) and (400) of the coating layer 52 is taken as Q and when a value Q on the rake face (upper face 31 of FIGS. 9, 10), a value Q on the flank face (the upper face 32 of FIGS. 9, 10) and a value Q on the cutting edge (inner cutting edge 25, outer cutting edge 26 of FIG. 12) are respectively $Q_r$, $Q_f$ and $Q_e$, "$Q_r > Q_e > Q_f$" hold.

Further, it is preferable that the coating layer 52 be formed by physical vapor deposition (PVD) as in the second embodiment, and it is more preferable that the layer be formed by arc ion plating in the respect of obtaining the hardness and adhesiveness.

According to the present embodiment, the film formation is performed while the orientation of the sample is revolved with the rake face, the cutting edge and the flank face each being revolved by 45° during the film formation. Performing the film formation on this condition can control the coating layer 36 in the direction of crystal growth. Further, since variations in thickness of the whole circumstance of the cutting edge of each sample can be made smaller, even when the whole thickness becomes larger, the sample is resistant to partial formation of a portion subject to chipping. Other processings are similar to those in the second embodiment.

Example 1

Using a tungsten carbide (WC) powder with an average particle size of 0.8 μm as a principal ingredient, a metallic cobalt (Co) powder with an average particle size of 1.2 μm, a vanadium carbide (VC) powder with an average particle size of 1.0 μm, and a chrome carbide ($Cr_3C_2$) powder with an average particle size of 1.0 μm were added and mixed at the rate of 10% by mass, 0.2% by mass and 0.6% by mass, to be molded into the shape of a cutting tool for cutting edge replaceable milling (BDMT11T308ER-JT) by press molding, which was then subjected to debinding and sintering at 1450° C. in vacuum of 0.01 Pa for one hour, to produce cemented carbide. Further, the surface of the rake face of each sample was polished by blasting, blushing or the like, and the cutting edge was formed with honing. Moreover, the produced cemented carbide was subjected to blushing, and then honing, so as to set a honing amount to $R_r$=0.03 mm and $R_f$=0.02 mm. On the substrate as thus produced, a coating layer with a TiAlN composition was formed by sputtering at a coating temperature of 500° C. on conditions shown in Table 1. It is to be noted that a revolution speed of each sample shown in Table 1 is the number of revolutions per minute in the way of counting as one time a full circle of the tower 16 holding the sample 15 in the pattern view of the film formation apparatus as seen from the above shown in FIG. 5. It should be noted that in FIG. 5, numeral 17 denotes a target, and a numeral 18 denotes a sample stage. Further, the thickness of the coating layer was measured at the center position of the flank face.

TABLE 1

| | Film forming conditions | | | | Coating layer | | | |
|---|---|---|---|---|---|---|---|---|
| Sample No. | Bias voltage (V) | Gas pressure (Pa) | Vapor deposition time (min.) | Revolution speed (rpm/min.) | Layer thickness (μm) | $P_s$ | $p_b$ | $P_s/p_b$ |
| I-1 | 100 | Former 2.5 | 45 | 2.5 | 8.5 | 0.95 | 0.20 | 4.75 |
| | | Latter 4 | 45 | 5 | | | | |
| I-2 | 100 | 4 | 55 | 2 | 4 | 0.31 | 0.23 | 1.35 |
| | | | | 6 | | | | |
| I-3 | Initial 80 | Initial 3 | 70 | 3.5 | 6.0 | 0.45 | 0.17 | 2.65 |
| | Final 120 | Final 4 | | 8 | | | | |
| I-4 | Initial 80 | 3.5 | 80 | 3 | 8 | 0.64 | 0.21 | 3.05 |
| | Final 100 | | | 7.5 | | | | |

TABLE 1-continued

| | Film forming conditions | | | | Coating layer | | | |
|---|---|---|---|---|---|---|---|---|
| Sample No. | Bias voltage (V) | Gas pressure (Pa) | Vapor deposition time (min.) | Revolution speed (rpm/min.) | Layer thickness (μm) | $P_s$ | $p_b$ | $P_s/p_b$ |
| I-5 | 120 | Former 3 Latter 4.5 | 40 20 | 3.5 7.5 | 5.5 | 0.70 | 0.27 | 2.59 |
| *I-6 | 95 | 4 | 40 | 4 | 7.7 | 0.21 | 0.21 | 1.00 |
| *I-7 | 90 | 4 | 15 15 | 4 5 | 2.5 | 0.30 | 0.23 | 1.30 |
| *I-8 | 100 | 3 | 110 80 | 5.5 2 | 9.5 | 1.00 | 0.22 | 4.55 |
| *I-9 | 150 | 4 | 65 | 6 | 5.1 | 0.29 | 0.29 | 1.00 |

*shows a sample outside the scope of the present invention.

Each of the obtained samples (I–1 to I–9) was subjected to a thin film X-ray diffraction analysis, to measure a peak strength ratio p of I(400)/I(311). It is to be noted that measurement conditions were: an incident angle of 2.0°; Cu—Kα rays; a step angle of 0.02°; and the time of 2 seconds. Further, as for $p_s$, the surface of the coating layer was not polished and the X-rays were applied onto the surface as it was to perform a thin film X-ray diffraction measurement, and as for $p_b$, etching was performed until the layer thickness becomes within 1.5 μm (about 1 μm) and the X-rays were then applied onto the exposed face of the coating layer to perform the thin film X-ray diffraction measurement, and $p_s$ and $p_b$ were calculated from diffraction peaks. Moreover, each insert was fixed to a holder, to produce the end mill of FIG. 1, and a cutting test was conducted on the following conditions.

Cutting method: Milling
Material to be cut: SKD11
Cutting speed: 150 m/min
Feeding: 0.12 mm/tooth
Cutting: lateral cutting 10 mm, depth cutting 3 mm
Cutting state: Wet
Evaluation method: The cutting edge was observed at the time point when the cutting has been done for 15 minutes, while an abrasion amount (width) on the flank face was measured. It is to be noted that caution should be taken not to include an amount of honing having been done in the abrasion width.

TABLE 2

| | Cutting evaluation | | |
|---|---|---|---|
| Sample No. | Abrasion width (mm) | Boundary-damage life | State of cutting blade |
| I-1 | 0.06 | 45 min | Good |
| I-2 | 0.12 | 54 min | Good |
| I-3 | 0.03 | >90 min | Good |
| I-4 | 0.03 | 70 min | Good |
| I-5 | 0.08 | 80 min (Stopped due to large nose abrasion) | Good |
| *I-6 | 0.11 | 30 min | Peeled |
| *I-7 | 0.32 | 35 min | Boundary damaged |
| *I-8 | Chipped 10 min later | | Peeled |
| *I-9 | 0.22 | 22 min | Micro peeled |

*shows a sample outside the scope of the present invention.

According to Tables 1, 2, in each of Samples No. I-6 and I-9 with the revolution timing thereof made constant during the film formation period, $p_s$ and $p_b$ were the same, $p_s/p_b$ was not larger than 1, and the tool life was short in the cutting test. Further, in Samples No. I-7 with the thickness of the coating layer being smaller than 3 μm, boundary damage occurred at the early stage, while in Samples No. I-8 with the thickness of the coating layer being larger than 9 μm, micro flaking of the coating layer occurred, and hence in both samples, abrasion developed to shorten the tool lives.

As opposed to this, Sample No. I-1 to I-5 where $p_s/p_b$ is larger than 1, namely $p_s$ is larger than $p_b$, had good cutting performance.

Example 2

Using a tungsten carbide (WC) powder with an average particle size of 1.5 μm as a principal ingredient, a metallic cobalt (Co) powder with an average particle size of 1.2 μm, a titanium carbide (TiC) powder with an average particle size of 1.5 μm, and a tantalum carbide (TaC) powder with an average particle size of 1.0 μm were added and mixed at the rate of 10% by mass, 3% by mass and 7% by mass, to be molded into the shape of a cutting tool for a cutting edge replaceable boning drill (ZCMT06T204) by press molding, which was then subjected to debinding and sintering at 1450° C. in vacuum of 0.01 Pa for one hour, to produce cemented carbide. Further, the rake face surface of each sample was polished by blasting, blushing or the like. Moreover, the produced cemented carbide was subjected to blushing for honing such that the honing amount R was "0.02 mm≦R≦0.04 mm."

On the substrate as thus produced, coating layers with a variety of compositions were formed on the coating conditions shown in Table 1, using the film formation apparatus including both a magnetron sputtering cathode and an arc ion plating cathode. It is to be noted that the conditions for forming the lower layer were: sputtering; a film formation temperature of 500° C.; a repeated frequency of 50 kHz; a duty cycle of 75%; passing of a nitrogen gas of 0.3 to 0.8 Pa; and conditions shown in Table 3.

Next, the conditions for forming the upper layer were: arc ion plating; a film formation temperature of 550° C.; introduction of a nitrogen ($N_2$) gas of 3.8 Pa into a chamber; and conditions shown in Table 1, to form the upper layer for production of the insert.

The rake face and the flank face of each of the obtained samples (II-1 to II-9) were precisely cut vertically to the cutting edge for observing the cross sections thereof, to measure the thickness of the coating layer from scanning electron micrograph (SEM) photographs. It is to be noted that the thickness of the coating layer was the largest on the cutting edge. Further, the flank face was polished obliquely to the flank face with an angle of 1°, and the X-ray diffraction analysis was performed in predetermined positions on the unpolished face and the polished face. A collimator diameter of 0.3 mmφ, an output of 45 kV, 110 mA, an incident angle of 2.0°, Cu—Kα rays, a step angle of 0.02°, and the time of 2 seconds were set. $P_1$, $P_2$ and $P_3$ were calculated from diffractions peaks obtained by the X-ray diffraction analysis.

This insert was then mounted in the tool body (throwaway drill holder S25-DRZ1734-06, manufactured by KYOCERA Corporation) of FIG. 6 to conduct the following cutting test, and cutting performance was evaluated.
Cutting method: Milling (drilling)
Material to be cut: ductile cast iron (FCD450)
Cutting speed: 140 m/min
Feeding: 0.12 mm/tooth
Cutting: hole diameter 20 mm, hole depth 40 mm
Cutting state: Wet
Evaluation method: The cutting was performed with 400-hole processing set as an upper limit, and the number of processing until occurrence of chipping of the inner cutting edge (or outer cutting edge) was recorded. Further, as for the outer cutting edge, after processing of 150 holes, an abrasion amount on the flank face was measured and abrasion resistance was also compared.

Results are shown in Tables 3 and 4.

the value $P_1$, the value $P_2$ and the value $P_3$ were almost the same, chipping occurred. Moreover, in Samples No. II-6, II-7 where the revolving speed of the sample in forming the upper layer is lower than the revolution speed of the sample in forming the lower layer, the value $P_1$, the value $P_2$ and the value $P_3$ were "$P_3<P_2<P_1$", and the abrasion width was large and the boundary-damage life was also large.

As opposed to this, Samples No. II-1 to II-5 each formed with the revolution speed in forming the upper layer with respect to the revolution speed of the sample in forming the lower layer being at the ratio of 1.1 to 3.0, "$P_3<P_2<P_1$" held, and both the abrasion resistance and the fracture resistance were high.

Example 3

With regard to a substrate produced in a similar manner to in Example 2, the sample was placed inside the film formation apparatus in the state of FIG. 7, and a nitrogen ($N_2$) gas was introduced into the chamber by arc ion plating, to form a

TABLE 3

| Sample No. | Film forming conditions (Lower layer) | | Film forming conditions (Upper layer) | | | Cutting blade | | Flank face | | |
|---|---|---|---|---|---|---|---|---|---|---|
| | Pulse power (Kw) | Revolving speed RL (rpm/min.) | Bias voltage (V) | Revolving speed RU (rpm/min.) | RU/RL | Te (μm) | A (te/Te) | $P_3$ | $P_2$ | $P_1$ |
| II-1 | 5 | 3 | 80 | 4 | 1.1 | 7.5 | 0.41 | 0.14 | 0.20 | 0.25 |
| II-2 | 5 | 3 | 50 | 6 | 2.7 | 8 | 0.15 | 0.11 | 0.12 | 0.15 |
| II-3 | 3 | 3 | 35 | 4 | 1.3 | 7 | 0.33 | 0.11 | 0.22 | 0.41 |
| II-4 | 4.5 | 3.5 | 30 | 4 | 1.5 | 5 | 0.30 | 0.18 | 0.23 | 0.30 |
| II-5 | 6 | 6 | 50 | 6 | 2.0 | 12 | 0.53 | 0.10 | 0.15 | 0.34 |
| *II-6 | 5 | 5 | 40 | 3 | 0.6 | 4 | 0.10 | 0.59 | 0.26 | 0.19 |
| *II-7 | 4 | 6 | 100 | 4 | 0.7 | 5.5 | 0.35 | 0.48 | 0.14 | 0.07 |
| *II-8 | 3.5 | 2 | 25 | 7 | 3.5 | 6.5 | 0.29 | 0.17 | 0.17 | 0.16 |
| *II-9 | 4.5 | 2.5 | 50 | 4 | 1.0 | 13 | 0.20 | 0.40 | 0.38 | 0.38 |

*shows a sample outside the scope of the present invention.

TABLE 4

| Sample No. | Central position of flank face | | | | | | | Cutting evaluation | | |
|---|---|---|---|---|---|---|---|---|---|---|
| | p | | | $T_f$ (μm) | a | | | Abrasion width (mm) | Boundary-damage life | State of cutting blade |
| | $p_s$ | $p_b$ | $p_s/p_b$ | | $(t_f/T_f)$ | $T_e/T_f$ | A/a | | | |
| II-1 | 0.38 | 0.23 | 1.65 | 4.5 | 0.32 | 1.7 | 1.3 | 0.15 | 350 holes | Good |
| II-2 | 0.81 | 0.17 | 4.76 | 7 | 0.30 | 1.1 | 0.5 | 0.18 | 320 holes | Good |
| II-3 | 0.52 | 0.33 | 1.58 | 3 | 0.47 | 2.3 | 0.7 | 0.09 | >400 holes | Good |
| II-4 | 0.44 | 0.16 | 2.75 | 3.5 | 0.41 | 1.4 | 0.7 | 0.11 | 395 holes | Good |
| II-5 | 0.51 | 0.13 | 3.92 | 7 | 0.70 | 1.7 | 0.8 | 0.14 | 384 holes | Good |
| *II-6 | 0.12 | 0.31 | 0.39 | 2 | 0.05 | 2.0 | 2.0 | 0.55 | 250 holes | Boundary damaged |
| *II-7 | 1.02 | 0.82 | 1.24 | 4 | 0.56 | 1.4 | 0.6 | 0.32 | 182 holes | Peeled |
| *II-8 | 0.31 | 0.33 | 0.94 | 7 | 0.20 | 0.9 | 1.5 | 0.64 | 227 holes | Peeled |
| *II-9 | 0.65 | 0.62 | 1.05 | 10 | 0.32 | 1.3 | 0.6 | Chipped with 122 holes | | Chipped |

*shows a sample outside the scope of the present invention.

As apparent from the results of Tables 3 and 4, in Sample No. II-9 where the revolving speed of the sample in forming the lower layer is the same as the revolution speed in forming the upper layer, the value $P_3$ is larger than the value $P_1$ and the value $P_2$, and chipping occurred in the cutting edge. Further, in Sample No. II-8 produced in coating conditions where the bias voltage and the revolution speed were adjusted such that TiAlN coating layer with the thickness shown in Table 1 by PVD on a condition of a bias voltage of 35 V so as to produce an insert (III-1 to III-10). It is to be noted that as for Samples No. III-1 to III-5, the orientation of the sample was revolved with the rake face, the cutting edge and the flank face each being revolved by 45° with the sample supporting jig in the intermediate stage of the film formation.

The rake face and the flank face of each of the obtained samples were precisely cut vertically to the cutting edge for observing the cross section thereof, to measure the thickness of the coating layer from scanning electron micrograph (SEM) photographs. It is to be noted that the thickness of the coating layer was the largest on the cutting edge. Further, micro X-ray diffraction analysis was performed on the rake face, the cutting edge and the flank face. A collimator diameter was set to 0.3 mmϕ, and the flat center of each of the faces was measured. It is to be noted that a ray source of Cu—Kα rays, an output of 45 kV and 110 mA, an incident angle of 2.0°, Cu—Kα rays, a step angle of 0.02°, and the time of 2 seconds were set. $q_e$, $q_r$ and $q_f$ and $Q_r$, $Q_e$ and $Q_f$ were calculated from diffractions peaks obtained by the X-ray diffraction analysis.

TABLE 5

| Sample No. | Layer thickness (μm) | | q[1] | | | Q[2] | | | p | | |
|---|---|---|---|---|---|---|---|---|---|---|---|
| | Rake face | Flank face | $q_r$ | $q_f$ | $q_e$ | $Q_r$ | $Q_f$ | $Q_e$ | $p_s$ | $p_b$ | $p_s/p_b$ |
| III-1 | 3.3 | 4.8 | 0.055 | 0.051 | 0.066 | 0.033 | 0.022 | 0.035 | 0.49 | 0.24 | 2.04 |
| III-2 | 5.2 | 5.7 | 0.064 | 0.056 | 0.075 | 0.033 | 0.025 | 0.026 | 0.58 | 0.23 | 2.52 |
| III-3 | 7.8 | 6.5 | 0.064 | 0.054 | 0.066 | 0.028 | 0.032 | 0.030 | 0.55 | 0.23 | 2.39 |
| III-4 | 4.3 | 4.3 | 0.051 | 0.027 | 0.062 | 0.032 | 0.027 | 0.028 | 0.62 | 0.16 | 3.88 |
| III-5 | 10.0 | 8.5 | 0.052 | 0.055 | 0.071 | 0.023 | 0.033 | 0.025 | 0.73 | 0.39 | 1.87 |
| *III-6 | 5.5 | 5.6 | 0.055 | 0.052 | 0.050 | 0.035 | 0.031 | 0.030 | 0.48 | 0.08 | 6.00 |
| *III-7 | 11.0 | 11.7 | 0.063 | 0.058 | 0.066 | 0.034 | 0.034 | 0.032 | 0.12 | 0.07 | 1.71 |
| *III-8 | 1.7 | 1.8 | 0.052 | 0.030 | 0.058 | 0.029 | 0.023 | 0.024 | 0.49 | 0.54 | 0.91 |
| *III-9 | 3.7 | 4.0 | 0.056 | 0.051 | 0.056 | 0.033 | 0.022 | 0.033 | 0.45 | 0.45 | 1.00 |
| *III-10 | 5.0 | 5.6 | 0.048 | 0.061 | 0.046 | 0.031 | 0.033 | 0.034 | 0.44 | 0.51 | 0.86 |

*shows a sample outside the scope of the present invention.

This insert was then mounted in a tool body (throwaway drill holder S25-DRZ1734-06, manufactured by KYOCERA Corporation) of FIG. 1 to conduct the following cutting test, and cutting performance was evaluated.
Cutting method: Milling (drilling)
Material to be cut: Carbon steel (S45C)
Cutting speed: 150 m/min
Feeding: 0.25 mm/tooth
Cutting: hole diameter 20 mm, hole depth 20 mm
Cutting state: Wet
Evaluation method: The cutting was performed with 700-hole processing set as an upper limit, and the number of processing until occurrence of chipping of the inner cutting edge (or outer cutting edge) was recorded. Further, as for the outer cutting edge, after processing of 400 holes, an abrasion amount on the flank face was measured and abrasion resistance was also compared.
Results are shown in Table 6.

TABLE 6

| | Cutting characteristics | | |
|---|---|---|---|
| Sample No. | Edge section, state of appearance | Chipping life (inner blade) | Abrasion amount on flank face (outer blade) |
| III-1 | Good | >700 holes | 0.043 mm |
| III-2 | Good | >700 holes | 0.029 mm |
| III-3 | Good | >700 holes | 0.041 mm |
| III-4 | Good | >700 holes | 0.034 mm |
| III-5 | slightly adhering | 680 holes | 0.057 mm |
| *III-6 | slightly adhering | 550 holes | 0.093 mm |
| *III-7 | Peeled | 116 holes | — |
| *III-8 | Significantly abraded | 41 holes | — |
| *III-9 | chipped | 600 holes | 0.177 mm |
| *III-10 | Peeled | 145 holes | — |

*shows a sample outside the scope of the present invention.

As apparent from the results of Tables 5 and 6, in Sample No. III-8 with the thickness of the coating layer on the cutting edge being smaller than 3 μm, the abrasion amount of the insert was large. Further, in Sample No. III-7 with the thickness of the coating layer exceeding 10 μm, fracture resistance was poor. Moreover, in Sample No. III-6 where "$q_e<q_r$" holds, abrasion resistance was poor, and in sample No. III-9 where "$q_e=q_r$" holds, the inner cutting edge also becomes chipped at the early stage. Furthermore, in Sample No. III-10 where "$q_e<q_r$" and "$q_e<q_f$" hold, flaking of the coating layer occurred on the cutting edge at the time of visual inspection after completion of the film formation, and the cutting edge also becomes chipped at the early stage of the cutting.

As opposed to this, in each of Samples No. III-1 to III-5 where the thickness of the coating layer on the cutting edge was 3 to 10 μm and "$q_e>q_r$" and "$q_e>q_f$" hold according to the present invention, fracture resistance and abrasion resistance were high.

Example 4

Except for the use of the substrate and the coating layer with compositions described in Table 7, the coating layer was formed in a similar manner to in Example 3, to produce an insert, and a cutting test was conducted using each of materials to be cut in Table 8 on the following conditions, and evaluated in a similar manner to in Example 3 (IV-1 to IV-6). The results were shown in Table 8.
Cutting method: drilling
Cutting speed: 120 m/min
Feed: 0.1 mm/tooth
Cutting: Hole diameter 20 mm, Hole depth 40 mm
Cutting state: Wet
Evaluation method: The cutting was performed with 400-hole processing set as an upper limit, and the number of processing was recorded until occurrence of chipping of the inner cutting edge (or outer cutting edge). Further, as for the outer cutting edge, after processing of 200 holes, an abrasion amount on the flank face was measured and abrasion resistance was also compared.

TABLE 7

| | Blending composition (% by mass) | | | Interface roughness (μm) | Film forming conditions | | | |
|---|---|---|---|---|---|---|---|---|
| Sample No. | WC | Co | Other additives | | Bias voltage (V) | Gass pressure (Pa) | Vapor deposition time (min.) | Revolving speed (rpm/min.) |
| IV-1 | Remaining | 10 | TiC 2.1 TaC 7.2 | 0.1 | 100 | Former 2 Latter 4 | 45 45 | 2 5 |
| IV-2 | Remaining | 10 | $Cr_3C_2$ 0.6 | 0.05 | 100 | 4 | 55 | 2 5 |
| IV-3 | Remaining | 7.3 | TaC 0.7 ZrC 0.6 | 0.05 | Initial 80 Final 120 | Initial 3 Final 4 | 70 | 3.5 7 |
| *IV-4 | Remaining | 10 | $Cr_3C_2$ 0.6 | 0.2 | 100 | 4 | 70 | 5 |
| *IV-5 | Remaining | 6 | TiC 2.8 TaC 6.7 | 0.1 | 90 | 4 | 10 10 | 4 5 |
| *IV-6 | Remaining | 6.2 | TiC 1.5 TaC 3.4 ZrC 1.0 | 0.05 | 130 | 4 | 70 | 6 3 |

*shows a sample outside the scope of the present invention.

TABLE 8

| | Coating layer | | | | | | | |
|---|---|---|---|---|---|---|---|---|
| Sample No. | Composition | Film thickness (μm) | $p_s$ | $p_b$ | $p_s/p_b$ | Material to be cut | Life | State of cutting blade |
| IV-1 | $(Ti_{0.45}Al_{0.49}W_{0.03}Si_{0.02}Nb_{0.01})N$ | 4.8 | 0.41 | 0.24 | 1.71 | SCM440H | >400 holes | Good |
| IV-2 | $(Ti_{0.44}Al_{0.49}W_{0.02}Si_{0.03}Hf_{0.02})N$ | 3.0 | 0.39 | 0.23 | 1.70 | SUS304 | >400 holes | Good |
| IV-3 | $(Ti_{0.50}Al_{0.46}W_{0.02}Si_{0.01}Mo_{0.01})N$ | 5.5 | 0.54 | 0.21 | 2.57 | FCD450 | >400 holes | Good |
| *IV-4 | $(Ti_{0.48}Al_{0.47}W_{0.02}Nb_{0.02}Si_{0.01})N$ | 6.5 | 0.45 | 0.45 | 1.00 | SCM440H | 228 holes | Significantly abraded, chipped |
| *IV-5 | $(Ti_{0.32}Al_{0.45}W_{0.05}Si_{0.06}Mo_{0.12})C_{0.5}N_{0.5}$ | 1.3 | 0.28 | 0.21 | 1.33 | FCD450 | 68 holes | Stopped processing |
| *IV-6 | $(Ti_{0.43}Al_{0.42}W_{0.07}Si_{0.06}Mo_{0.02})N$ | 4.7 | 0.30 | 0.34 | 0.88 | SUS304 | 251 holes | Significantly abraded |

*shows a sample outside the scope of the present invention.

According to Tables 7 and 8, in Samples No. IV-4, IV-6 where $p_s/p_b$ is not larger than 1, the tool life was also short in the cutting test. Further, in Sample No. IV-5 where the thickness of the coating layer was shorter than 3 μm, the boundary damage occurred at the early stage and abrasion develops, to shorten the tool life. As opposed to this, in Samples No. IV-1 to IV-3 where $p_s/p_b$ was larger than 1, namely $p_s$ was larger than $p_b$, cutting performance was good.

EXPLANATION OF REFERENCE NUMERALS

Figure 1:
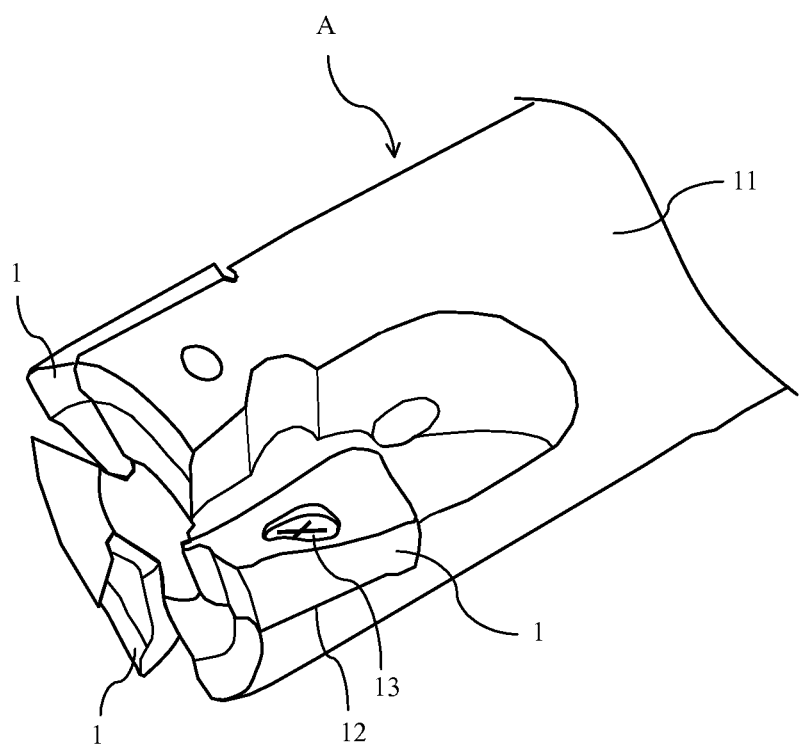
FIG. 1 is a schematic perspective view showing an example of throwaway milling tools as a first embodiment of a cutting tool according to the present invention.
Figure 2:
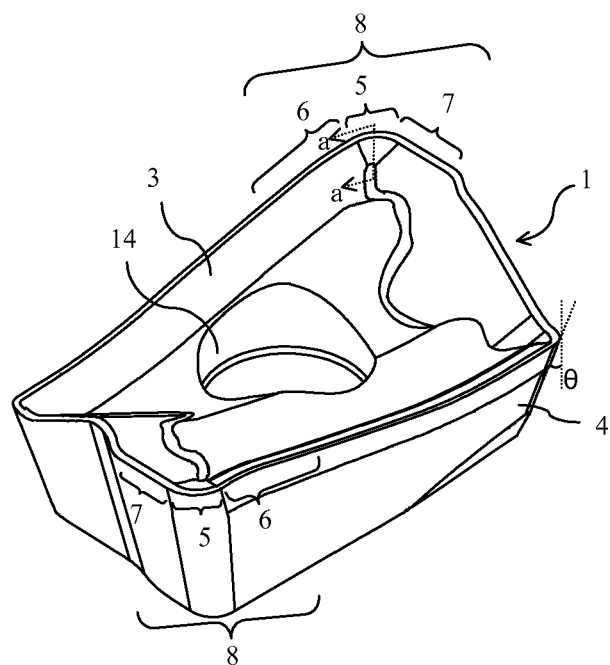
FIG. 2 shows an example of throwaway inserts to be mounted on the throwaway milling tool of FIG. 1, where (a) is a schematic perspective view and (b) is a plan view.
Figure 2:
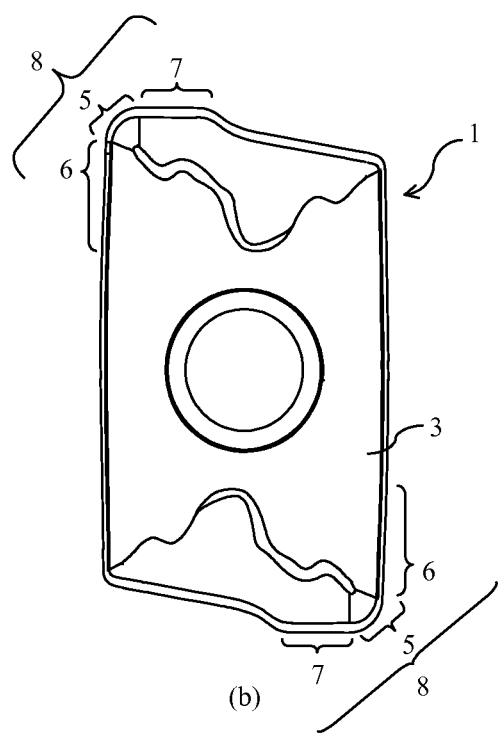
Figure 3:
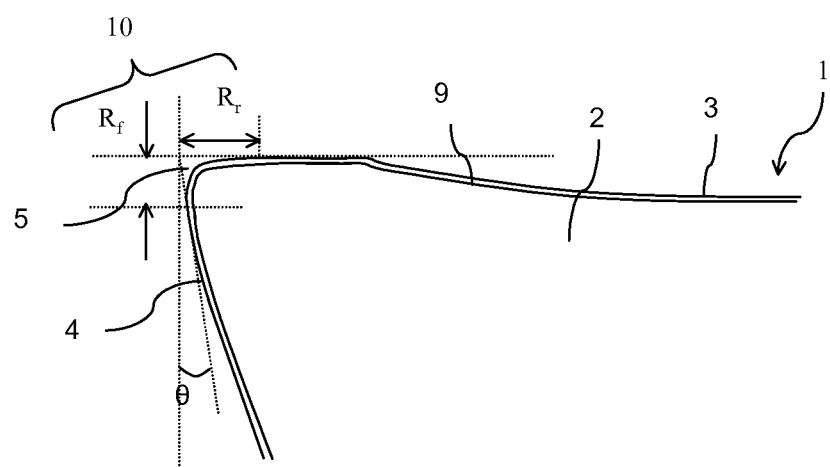
FIG. 3 is a schematic sectional view along ling a-a in FIG. 2(a)
Figure 4:
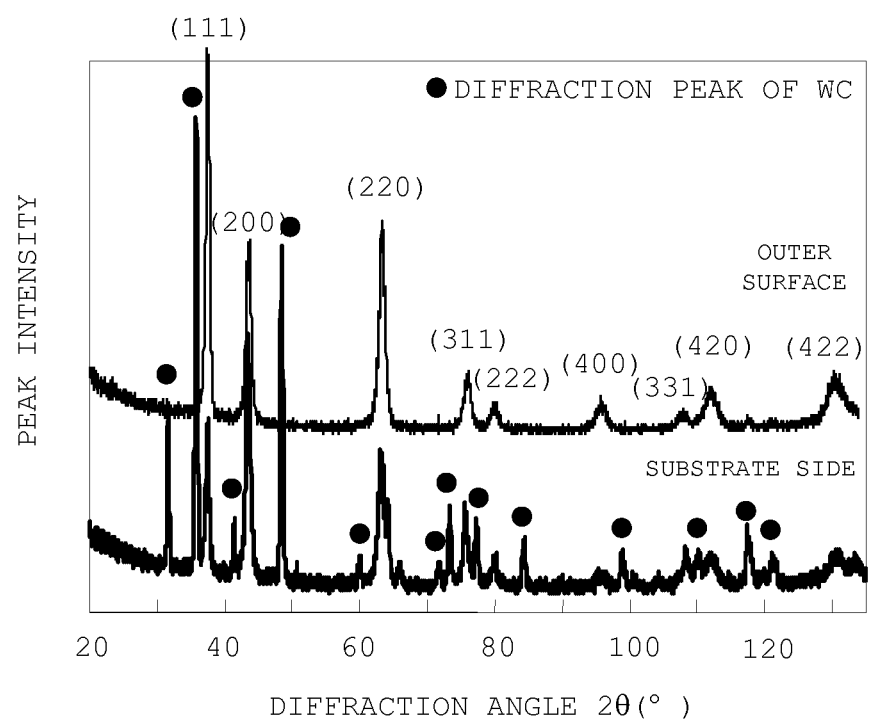
FIG. 4 shows a thin film X-ray diffraction pattern concerning a coating layer of the throwaway insert of FIG. 3, where (a) is a thin film X-ray diffraction pattern at the time of applying X-rays from the outer surface of the coating layer, and (b) is a thin film X-ray diffraction pattern at the time of applying X-rays onto an exposed surface after removal of the upper portion of the coating layer such that its thickness is within 1.5 μm from the substrate.
Figure 5:
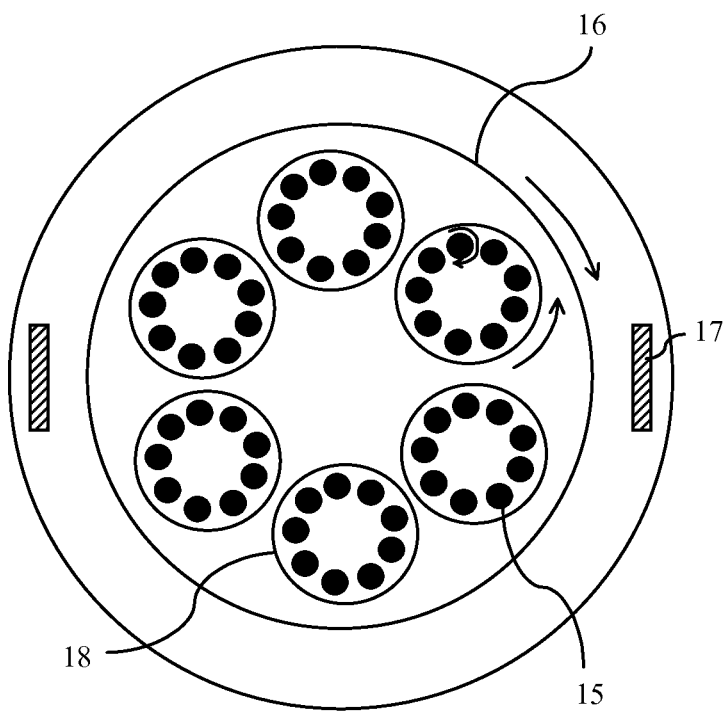
FIG. 5 is a pattern view of a film formation apparatus, which forms a coating layer of the cutting tool in Example 1 (first embodiment) of the cutting tool according to the present invention, seen from the above for explaining an arrangement of the film formation apparatus.
Figure 6:
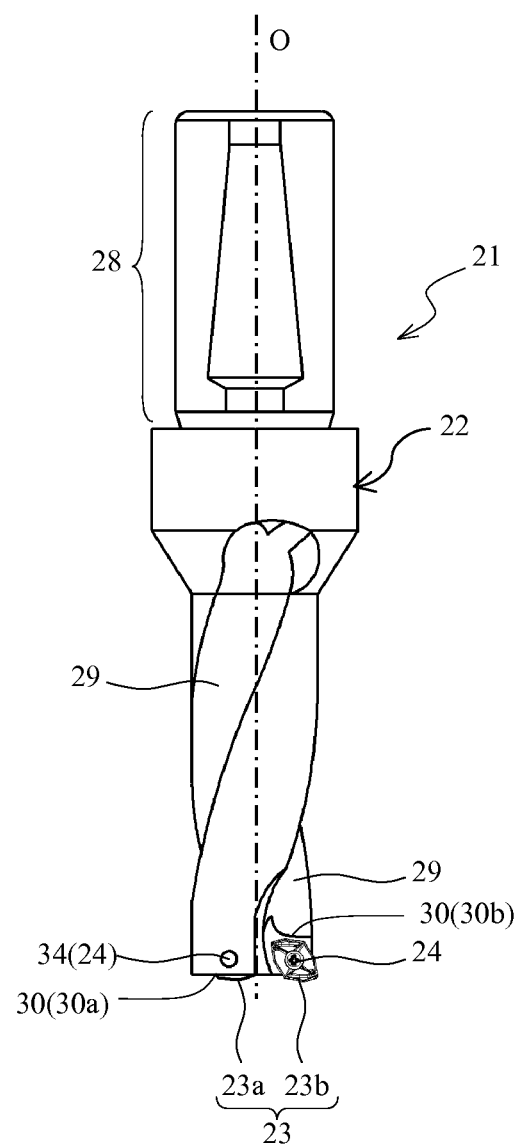
FIG. 6 is a schematic side view showing a drill in accordance with a second embodiment of the cutting tool according to the present invention.
Figure 7:
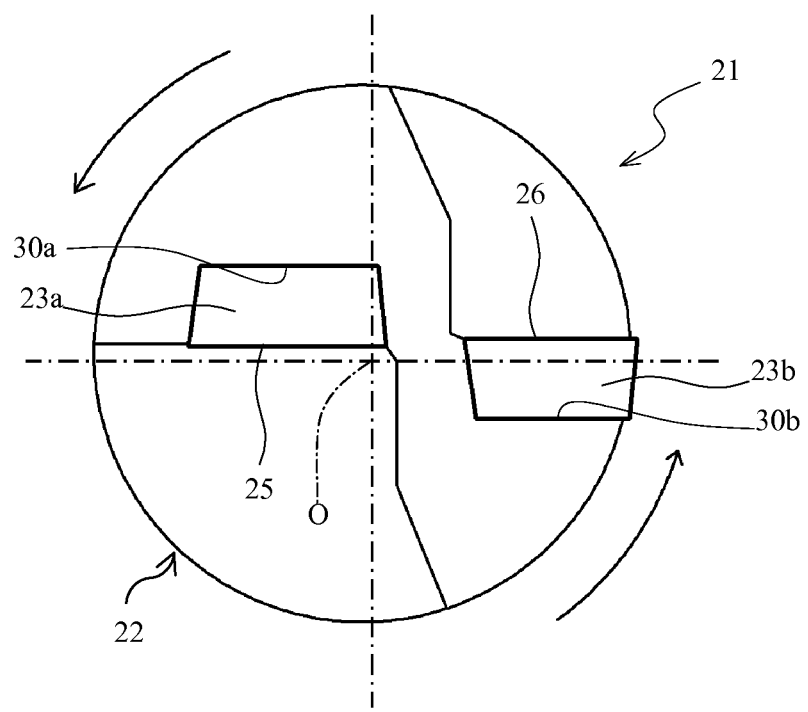
FIG. 7 is a schematic front view of the drill of FIG. 6 seen from its insert section.
Figure 8:
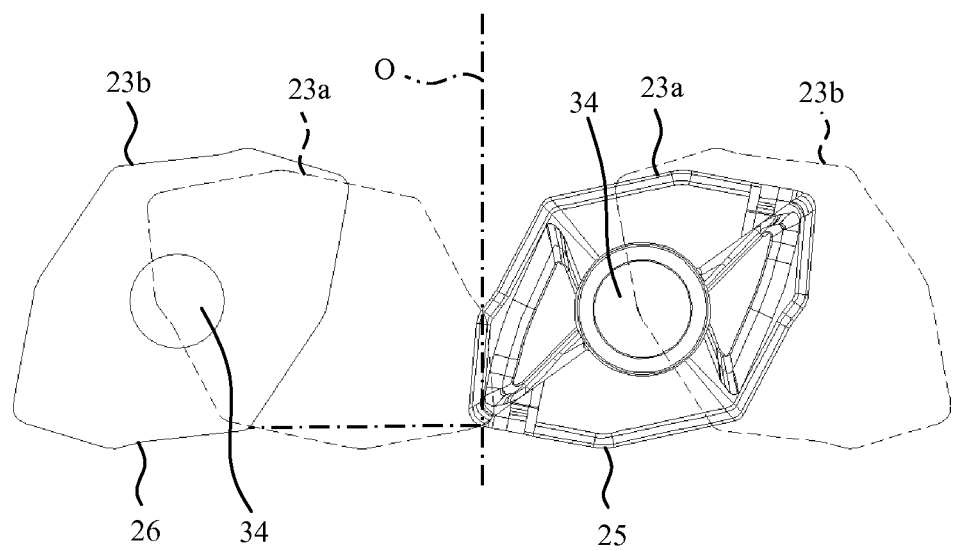
FIG. 8 is a pattern view for explaining arrangements of an outer cutting edge and an inner cutting edge at the time of cutting with the drill of FIG. 6.
Figure 9:
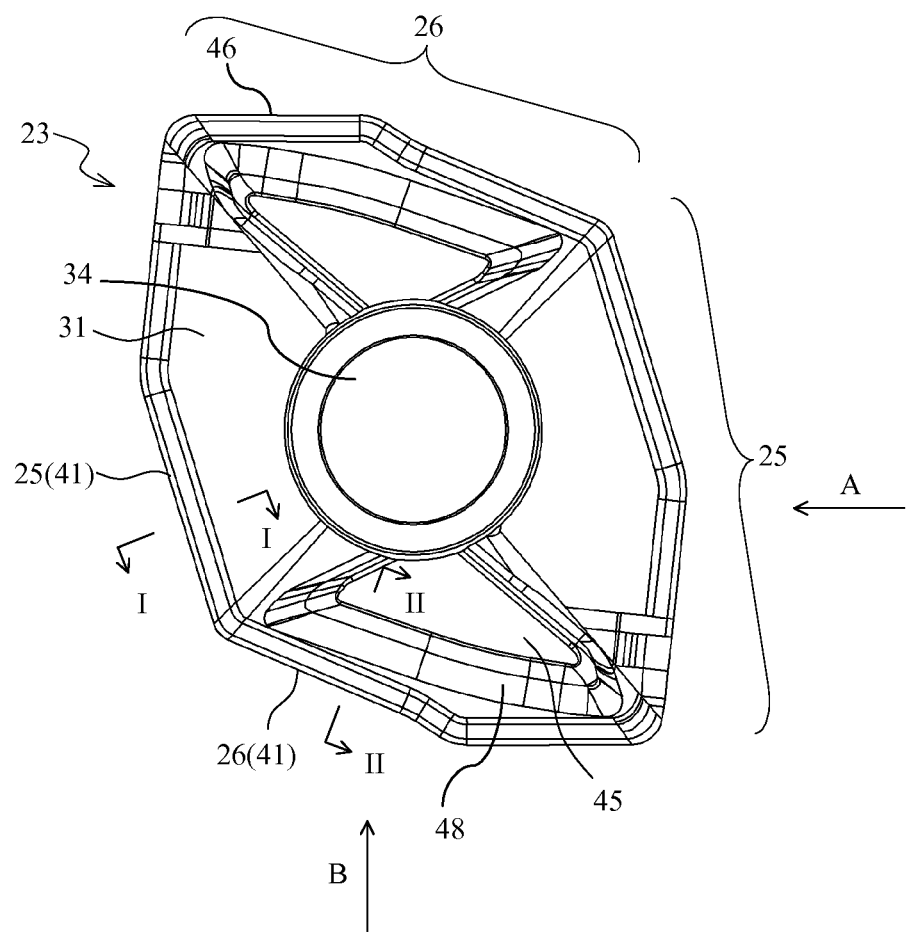
FIG. 9 is a plan view showing a throwaway insert (insert) to be mounted in the drill of FIG. 6.
Figure 10:
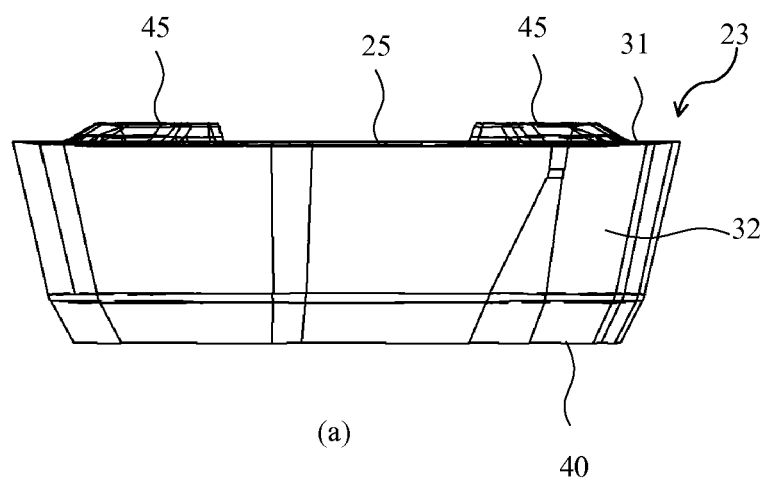
FIG. 10 shows the insert of FIG. 9, where (a) is a side view seen from an arrow A side, and (b) is a side view seen from an arrow B side.
Figure 10:
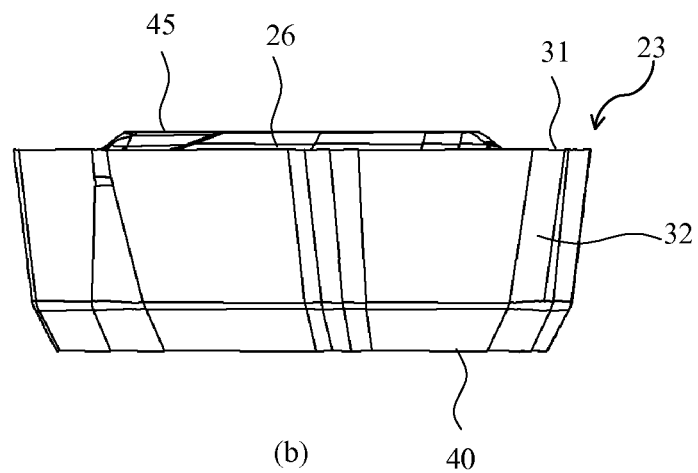
Figure 11:
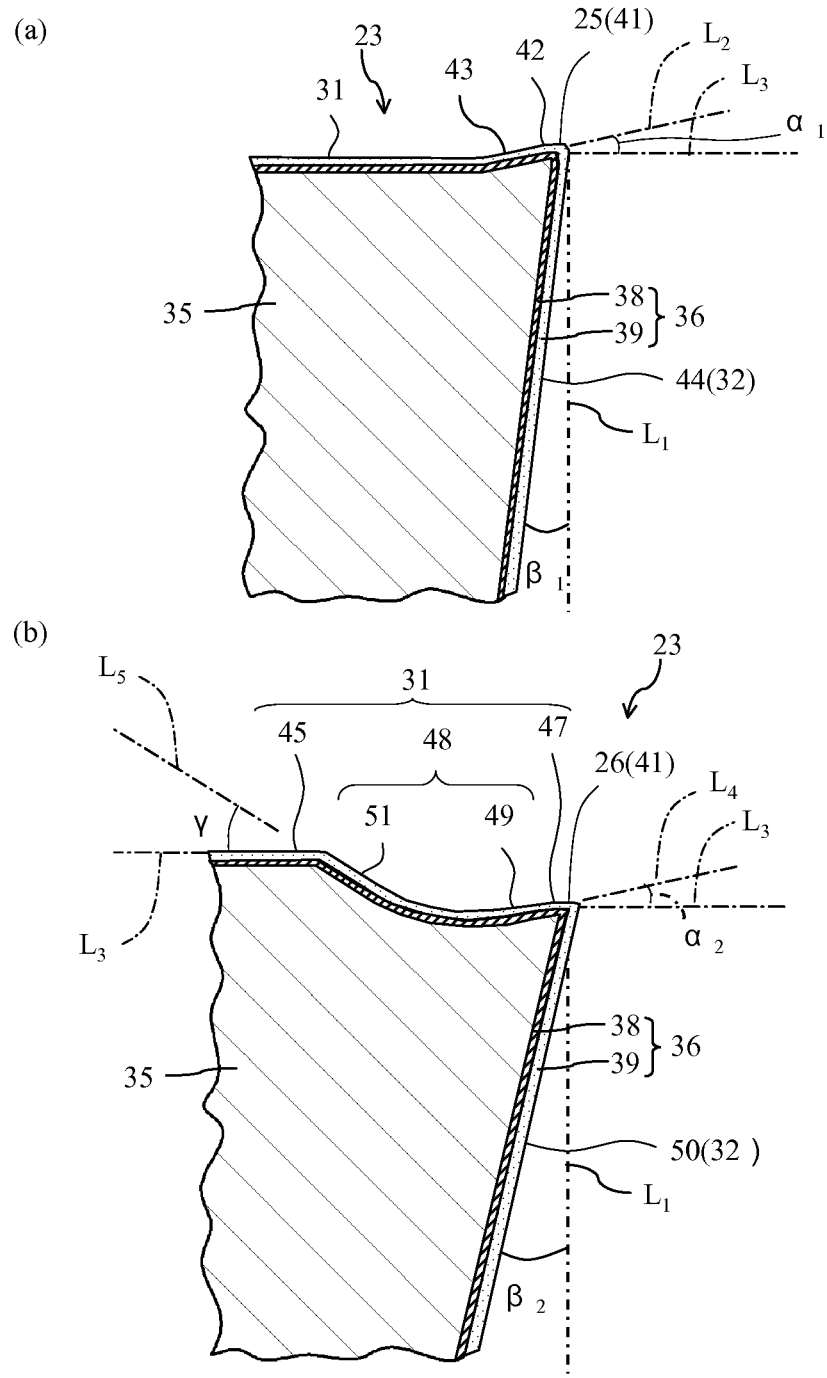
FIG. 11 shows the insert of FIG. 9, where (a) is an expanded view showing a cross section along line I-I, and (b) an expanded view showing a cross section along line II-II.
Figure 12:
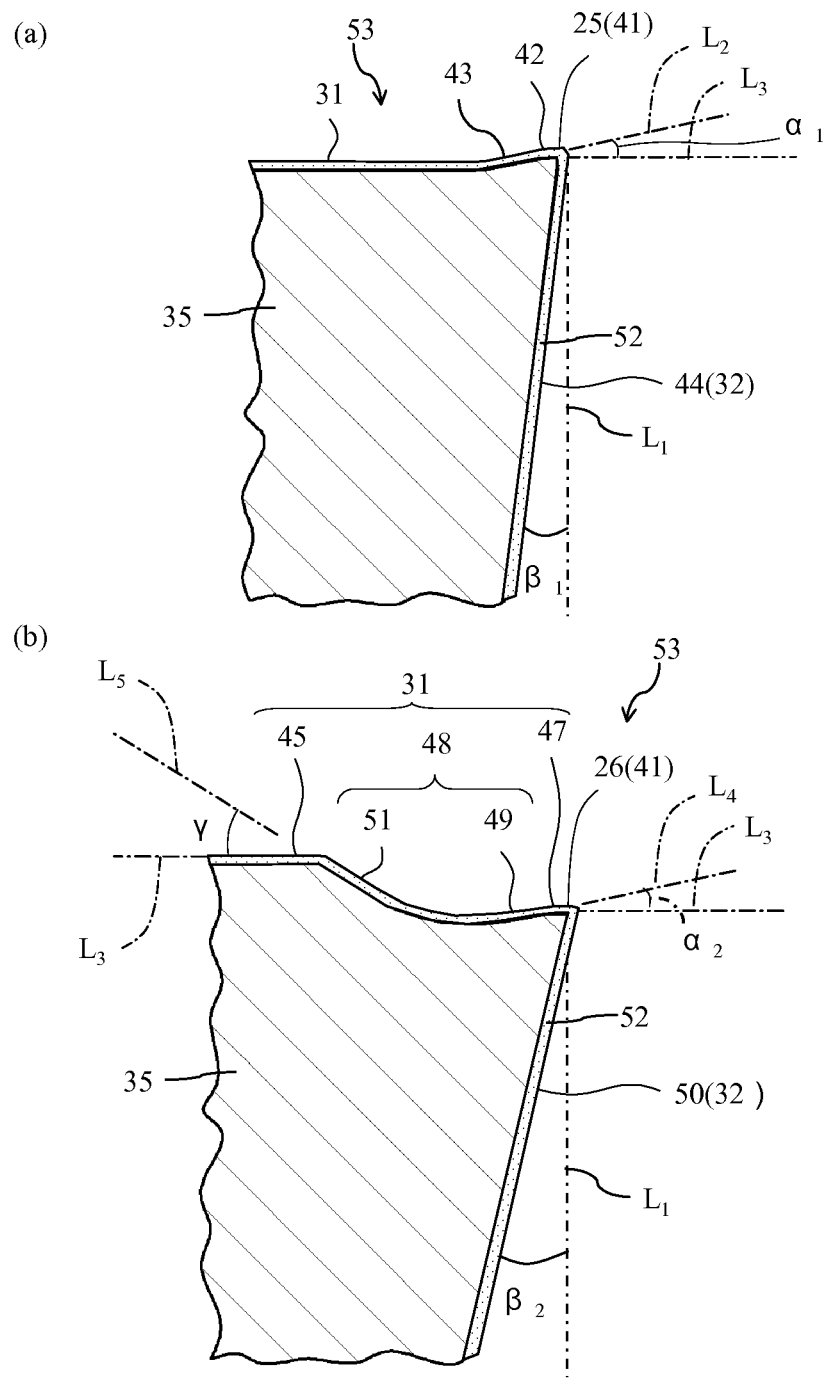
FIG. 12 shows the insert of FIG. 9 in the drill of the second embodiment in another embodiment (third embodiment), where (a) is an expanded view showing a cross section along the line I-I, and (b) is an expanded view showing a cross section along the line II-II.
Figure 13:
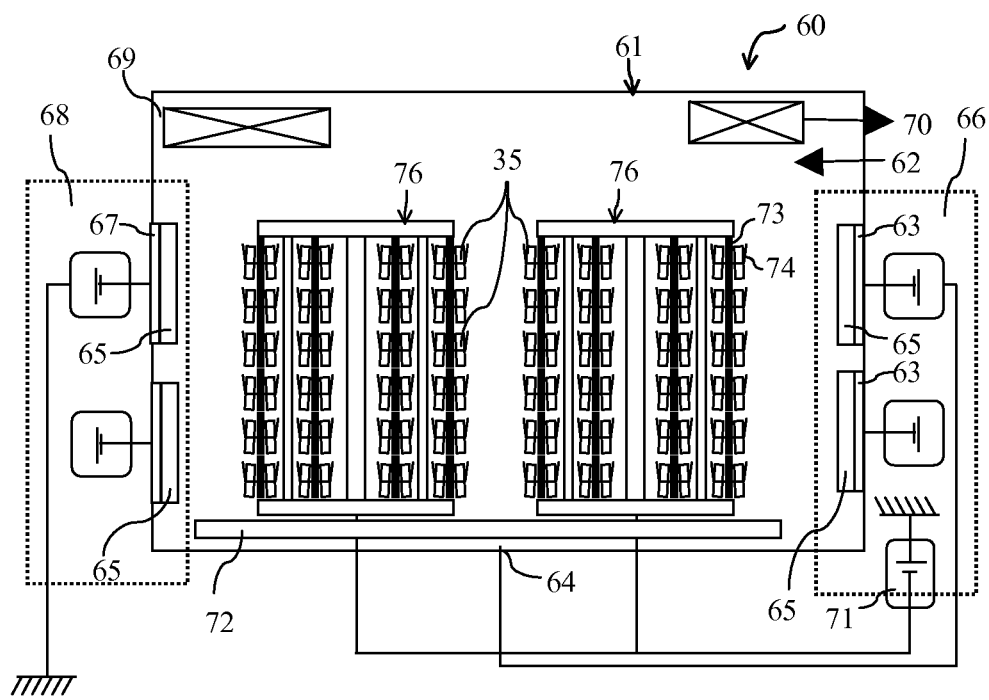
FIG. 13 is a pattern view of a film formation apparatus as an example of methods for forming a coating layer of the insert of FIGS. 11 and 12.

| | |
|---|---|
| A: | Throwaway milling tool (tool) |
| 1 | Throwaway insert (insert) |
| 2 | Substrate |
| 3 | Rake face |
| 4 | Flank face |
| 5 | Corner cutting edge |
| 6 | Major cutting edge |
| 7 | Minor cutting edge |
| 8 | Cutting edge |
| 9 | Coating layer |
| 10 | Honing |
| $R_r$ | Honing amount $R_r$ on rake face 3 side |
| $R_f$ | Honing amount $R_f$ on flank face 4 side |
| 11 | Holder |
| 12 | Insert pocket |
| 13 | Screw |
| 14 | Screw hole |
| 15 | Sample |
| 16 | Tower |
| 17 | Target |
| 18 | Sample stage |
| 21 | Drill |
| 22 | Tool body |
| 23, 53 | Throwaway insert (insert) |
| 23a | One insert |
| 23b | Another insert |
| 24 | Screw |
| 25 | Inner cutting edge |
| 26 | Outer cutting edge |
| 28 | Shank section |
| 29 | Chip discharge groove |
| 30 | Insert pocket |
| 30a | Inner-side insert pocket |
| 30b | Outer-side insert pocket |
| 31 | Upper face |
| 32 | Side face |
| 34 | Through hole |
| 35 | Substrate |
| 36, 52 | Coating layer |
| 38 | Lower layer |
| 39 | Upper layer |
| 40 | Lower face (seated face) |
| 41 | Cross ridge line section |
| 42 | Inner-cutting-edge land |
| 43 | Inner-cutting-edge rake face |
| 44 | Inner-cutting-edge flank face |
| 45 | Outer-cutting-edge land section |
| 46 | Protrusion |
| 47 | Outer-cutting-edge land |
| 48 | Outer-cutting-edge breaker groove |
| 49 | Outer-cutting-edge rake face |
| 50 | Outer-cutting-edge flank face |
| 51 | Outer-cutting-edge rising face |
| 60 | Film formation apparatus |
| 61 | Vacuum chamber |
| 62 | Gas inlet |
| 63, 67 | Cathode electrode |
| 64 | Anode electrode |
| 65 | Target |
| 66 | Arc ion plating section |
| 68 | Sputtering section |
| 69 | Heater |
| 70 | Gas outlet |
| 71 | Bias power supply |
| 72 | Table |
| 73 | Sample supporting jig |
| 74 | Sample supporting section |
| 76 | Tower |
| O | Drill rotating axis |
| $L_1$ | Line vertical to lower surface (seated face) |
| $L_2$ | Virtual extended line of inner-cutting-edge rake face |
| $L_3$ | Line parallel to lower face (seated face) |
| $L_4$ | Virtual extended line of outer-cutting-edge rake face |
| $L_5$ | Virtual extended line of outer-cutting-edge rising face |
| $\alpha_1$ | Inner-cutting-edge rake angle |
| $\alpha_2$ | Outer-cutting-edge rake angle |
| $\beta_1$ | Inner-cutting-edge flank angle |
| $\beta_2$ | Outer-cutting-edge flank angle |
| $\gamma$ | Raising angle |

The invention claimed is:

1. A cutting tool, comprising:
a substrate; and
a coating layer on the substrate:
consisting of nitride or carbonitride containing Ti and Al; and
having a thickness of 3 to 9 μm on a flank face,
wherein a first intensity ratio I(400)/I(311) of a diffraction intensity I(400) of a plane (400) to a diffraction intensity I(311) of a plane (311) measured by a thin film X-ray diffraction method using Cu—Kα rays of the coating layer on an outer surface is larger than the first intensity ratio of the coating layer on the substrate side.

2. The cutting tool according to claim 1, wherein the first intensity ratio of the coating layer on an outer surface is 0.2 to 1.

3. The cutting tool according to claim 1, wherein the first intensity ratio of the coating layer on an exposed surface at a thickness of 1.5 μm from an interface of the coating layer with the substrate is 0.1 to 0.5.

4. The cutting tool according to claim 3, wherein a ratio of the first intensity ratio of the coating layer on an outer surface to the first intensity ratio of the coating layer on the exposed surface is 1.5 to 7.

5. The cutting tool according to claim 1, wherein:
the coating layer consists of a lower layer and an upper layer;
a second intensity ratio of I(400)/I(311) of a diffraction intensity I(400) to a diffraction intensity I(311) of the coating layer on a surface measured by a regular X-ray diffraction method using Cu—Kα rays is 0.1 to 0.5;
the second intensity ratio of the coating layer at an interface region on the polished face is smaller than that at the upper layer on a polished face; and
the second intensity ratio of the upper layer on the polished face is smaller than that on the surface.

6. The cutting tool according to claim 5, wherein:
a thickness of the coating layer on a cutting edge is 3 to 15 μm; and
a ratio of the thickness of the coating layer on the cutting edge to a thickness of the coating layer at a center position of the flank face is 1.2 to 3.8.

7. The cutting tool according to claim 6, wherein:
a first thickness ratio of a thickness of the lower layer on a cutting edge to the thickness of the coating layer on the cutting edge is 0.2 to 0.6; and
a ratio of a second thickness ratio, which is a ratio of a thickness of the lower layer at the center position of the flank face to the thickness of the coating layer at the center position of the flank face, to the first thickness ratio is 0.4 to 0.9.

8. The cutting tool according to claim 1, wherein:
the coating layer on a cutting edge has a thickness of 3 to 10 μm; and
a third intensity ratio of I(220)/I(111)+I(200)+I(220)+I(222)+I(400)) measured by a micro X-ray diffraction method using Cu—Kα rays of the coating layer on the cutting edge is larger than the third intensity ratio of the coating layer on a rake face and the third intensity ratio of the coating layer on the flank face.

9. The cutting tool according to claim 8, wherein the third intensity ratio of the coating layer on a rake face is larger than the third intensity ratio of the coating layer on the flank face.

10. The cutting tool according to claim 8, wherein:
a fourth intensity ratio of $I(400)/I(111)+I(200)+I(220)+I(222)+I(400))$ measured by a micro X-ray diffraction method using Cu—K$\alpha$ rays of the coating layer on the rake face is larger than the fourth intensity ratio of the coating layer on the cutting edge; and
the fourth intensity ratio of the coating layer on the cutting edge is larger than the fourth intensity ratio of the coating layer on the flank face.

* * * * *